United States Patent
Li et al.

(10) Patent No.: US 8,736,042 B2
(45) Date of Patent: *May 27, 2014

(54) DELAMINATION RESISTANT DEVICE PACKAGE HAVING RAISED BOND SURFACE AND MOLD LOCKING APERTURE

(75) Inventors: Felix C. Li, Sunnyvale, CA (US); Yee Kim Lee, Segamat (MY); Peng Soon Lim, Melaka (MY); Terh Kuen Yii, Kuala Lumpur (MY); Lee Han Meng@Eugene Lee, Muar (MY)

(73) Assignee: National Semiconductor Corporation, Santa Clara, CA (US)

( * ) Notice: Subject to any disclaimer, the term of this patent is extended or adjusted under 35 U.S.C. 154(b) by 310 days.

This patent is subject to a terminal disclaimer.

(21) Appl. No.: 13/324,749

(22) Filed: Dec. 13, 2011

(65) Prior Publication Data

US 2012/0080781 A1    Apr. 5, 2012

Related U.S. Application Data

(60) Division of application No. 12/191,158, filed on Aug. 13, 2008, now Pat. No. 8,097,934, which is a continuation-in-part of application No. 11/862,787, filed on Sep. 27, 2007, now Pat. No. 7,838,980.

(51) Int. Cl.
*H01L 23/48* (2006.01)
*H01L 23/52* (2006.01)
*H01L 23/495* (2006.01)

(52) U.S. Cl.
USPC ........... 257/692; 257/667; 257/669; 257/670; 257/676; 257/E23.043; 257/E23.066; 257/E21.499

(58) Field of Classification Search
USPC ........ 257/678, 667, 669, 670, 676, 666, 672, 257/690, 691, 692, 693, 730, 773, 784, 786, 257/787, E23.013, E23.047, E23.048, 257/E23.031, E23.032, E23.033, E23.034, 257/E23.037, E23.004, E23.043, E23.046, 257/E23.05, E23.066, E21.499

See application file for complete search history.

(56) References Cited

U.S. PATENT DOCUMENTS

| | | |
|---|---|---|
| 5,926,695 A | 7/1999 | Chu et al. |
| 6,054,754 A | 4/2000 | Bissey |
| 6,083,776 A | 7/2000 | Manteghi |
| 6,284,309 B1 | 9/2001 | Bishop et al. |
| 6,331,728 B1 | 12/2001 | Chang et al. |
| 6,504,236 B2 | 1/2003 | Bissey |
| 6,525,406 B1 | 2/2003 | Chung et al. |
| 6,576,491 B1 | 6/2003 | Chang et al. |
| 6,818,968 B1 | 11/2004 | Cheah |

(Continued)

*Primary Examiner* — Matthew Reames
*Assistant Examiner* — Dilinh Nguyen
(74) *Attorney, Agent, or Firm* — Eugene C. Conser; Wade J. Brady, III; Frederick J. Telecky, Jr.

(57) ABSTRACT

A semiconductor package configured to attain a thin profile and low moisture sensitivity. Packages of this invention can include a semiconductor die mounted on a die attachment site of a leadframe and further connected with a plurality of elongate I/O leads arranged about the die attach pad and extending in said first direction. The leadframe having an "up-set" bonding pad arranged with a bonding support for supporting a plurality of wire bonds and a large mold flow aperture in the up-set bonding pad. The package encapsulated in a mold material that surrounds the bonding support and flows through the large mold flow aperture to establish well supported wire bonds such that the package has low moisture sensitivity.

15 Claims, 5 Drawing Sheets

(56) References Cited

U.S. PATENT DOCUMENTS

| | | |
|---|---|---|
| 6,963,125 B2 | 11/2005 | Featherby et al. |
| 7,019,389 B2 | 3/2006 | Lai et al. |
| 7,078,809 B2 | 7/2006 | Yap et al. |
| 7,102,218 B2 | 9/2006 | Huang et al. |
| 7,339,257 B2 | 3/2008 | Ozawa et al. |
| 7,395,932 B2 * | 7/2008 | Chew et al. .................. 206/714 |
| 7,427,813 B1 | 9/2008 | Wang et al. |
| 7,466,024 B2 | 12/2008 | Ito et al. |
| 7,598,603 B2 | 10/2009 | Otremba |
| 7,663,246 B2 | 2/2010 | Chen et al. |
| 7,671,432 B2 | 3/2010 | Fujii |
| 7,772,044 B2 | 8/2010 | Ito et al. |
| 7,808,087 B2 | 10/2010 | Zhao et al. |
| 7,834,436 B2 | 11/2010 | Chen |
| 7,838,980 B1 * | 11/2010 | Lee et al. .................. 257/692 |
| 8,097,934 B1 * | 1/2012 | Li et al. .................. 257/667 |
| 2001/0040300 A1 | 11/2001 | Huang et al. |
| 2001/0048149 A1 | 12/2001 | Cheng et al. |
| 2002/0024122 A1 | 2/2002 | Jung et al. |
| 2002/0056903 A1 | 5/2002 | Li et al. |
| 2003/0038356 A1 | 2/2003 | Derderian |
| 2003/0160309 A1 | 8/2003 | Punzalan et al. |
| 2003/0227076 A1 | 12/2003 | Sugimori |
| 2004/0011699 A1 | 1/2004 | Park |
| 2004/0256707 A1 | 12/2004 | Sugimori |
| 2005/0051877 A1 | 3/2005 | Hsu |
| 2005/0230796 A1 | 10/2005 | Sakamoto et al. |
| 2006/0006510 A1 | 1/2006 | Koduri |
| 2006/0103002 A1 | 5/2006 | Ahn et al. |
| 2006/0110858 A1 | 5/2006 | Ahn et al. |
| 2007/0052075 A1 * | 3/2007 | Funato et al. .................. 257/676 |
| 2007/0120237 A1 | 5/2007 | Sakamoto et al. |
| 2007/0296077 A1 | 12/2007 | Moline |
| 2008/0017977 A1 | 1/2008 | Tseng et al. |
| 2008/0079124 A1 * | 4/2008 | Haga et al. .................. 257/666 |
| 2008/0099896 A1 | 5/2008 | Shen et al. |
| 2009/0020860 A1 | 1/2009 | Takahashi |
| 2009/0230520 A1 | 9/2009 | Lee et al. |
| 2009/0302442 A1 | 12/2009 | Camacho et al. |
| 2010/0029046 A1 | 2/2010 | Camacho et al. |

* cited by examiner

DELAMINATION RESISTANT DEVICE PACKAGE HAVING RAISED BOND SURFACE AND MOLD LOCKING APERTURE

CROSS-REFERENCE TO RELATED APPLICATIONS

This application is a divisional application of U.S. patent application Ser. No. 12/191,158 entitled "Delamination Resistant Device Package Having Low Moisture Sensitivity" by Felix Li, et al., filed on Aug. 13, 2008, which is a continuation-in-part of U.S. Pat. No. 7,838,980 entitled "TO263 Device Package Having Low Moisture Sensitivity" by Yee Kim Lee, et al., issued on Nov. 23, 2010. The foregoing applications and patents are hereby incorporated by reference in their entirety for all purposes.

TECHNICAL FIELD

The invention described herein relates generally to semiconductor device packaging and associated lead frames. In particular, the invention relates to cost effective packages and packaging methods that provide low moisture sensitivity when implemented in TO263 devices and other semiconductor packages.

BACKGROUND

The designation TO263 describes a family of semiconductor devices that facilitate a number of high power applications. The designation TO263 designates a family of surface mounted multi-lead devices that can operate as regulatable power supplies as well as operate in other capacities well known to those having ordinary skill in the art.

FIG. 1 illustrates one example of a prior art TO263 implementation (100). Although depicted here with five leads 101, the TO-263 package can be implemented using many different lead configurations having a varying number of leads.

Users have encountered a number of device failure mechanisms in the field and also report that existing package configurations suffer from a high sensitivity to moisture during reflow process or other operational environments. For these and other reasons, an improved design of such packages would be helpful in the industry.

SUMMARY OF THE INVENTION

In accordance with the principles of the present invention, package configurations methodologies are disclosed.

In one embodiment, a lead frame for a high power surface mounted semiconductor package is described. One such lead frame includes a die attach pad having a die attachment site and an elongate ground lead that extends from the die attach pad in a first direction. The lead frame further includes a plurality of elongate leads arranged about the die attach pad, said leads also extending in said first direction. Such leads may be configured as input/output leads. Also such leads may be arranged in a lead plane arranged above the die attach pad. The lead frame further includes an up-set bonding pad that is electrically connected with the die attach pad that includes a bonding support configured to support a plurality of wire bonds and arranged to include a large mold flow aperture between the die attachment site and the bonding support.

Another embodiment describes a high power surface mounted semiconductor package including a lead frame, an IC mounted to the lead frame, a set of wire bonds that electrically connect the lead frame to the IC, and a mold envelope for encasing the IC, the wire bonds and potions of the lead frame. The lead frame configured to include a die attach pad having a die attachment site upon which the IC is mounted and an elongate ground lead that extends in a first direction. The lead frame further includes elongate I/O leads arranged about the die attach pad and extending in the first direction. The lead frame further including an up-set bonding pad electrically connected with the die attach pad and including a bonding support configured to support at least some of the wire bonds and arranged to include a large mold flow aperture between the die attachment site and the bonding support such that the mold material of the mold envelope flows through the aperture encapsulating the package with the mold material, the envelope encapsulating the die; an upper portion of the attach pad; a portion of the ground lead; portions of the I/O leads, the up-set bonding pad; and the set of wire bonds and wherein the mold materials fills the mold flow aperture to form a mold locking feature.

These and other aspects of the present invention are described in greater detail in the following detailed description of the drawings set forth hereinbelow.

BRIEF DESCRIPTION OF THE DRAWINGS

The following detailed description will be more readily understood in conjunction with the accompanying drawings, in which.

It is to be understood that, in the drawings, like reference numerals designate like structural elements. Also, it is understood that the depictions in the Figures are not necessarily to scale.

DETAILED DESCRIPTION OF THE DRAWINGS

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

The following language describes various embodiments of semiconductor packages and construction methodologies. Also described is a related lead frame suitable for use in IC packaging implementations such as those disclosed herein. In particular, the disclosed embodiments describe a lead frame and associated package implementations leading to the construction of a thin profile low moisture sensitivity package. Such packages include, but are not limited to the TO-263 device package.

In one example, a package capable of operating in a high power environment is described. An embodiment of such a package includes a high-power, metal-oxide-semiconductor field effect transistor ("MOSFET") device. In one example of such a device, a number of lower-power devices can be formed in a single semiconductor die, or "chip," and the respective "gate" and "source" terminals of the devices are all formed on the top of the die and respectively connected in parallel by thin metal pads on the top surface of the die, which in turn, are internally connected, typically by wire bonds, to respective leads of the device package.

The "drain" terminals of the individual devices are all respectively formed on the bottom of the die, and are connected in parallel by a thin metal pad on the bottom surface of the die, which in turn, is internally connected, typically by solder, to a metal die-mounting pad, which then constitutes a third "lead," or terminal, of the package. Other types of two- and three-terminal, high-power electronic devices can be made in a similar fashion. The inventors specifically note that the principles of the invention are not limited to such packages, but cover a numbers of related devices as readily apparent to those of ordinary skill.

In one implementation, the inventors propose a replacement package and structure for use in high power applications. In a particular embodiment, the inventors contemplate the use of a lead frame and package construction of the present invention in a TO-263 package format as well as other package formats.

The inventors point out that one failure mode plaguing existing packages is the existence of so-called "delamination" failures which can degrade or destroy the electrical connections within IC packages. In one example, the inventors point out that such delamination failures can be especially problematic during reflow and other high temperature processes or operations.

Figure 1:
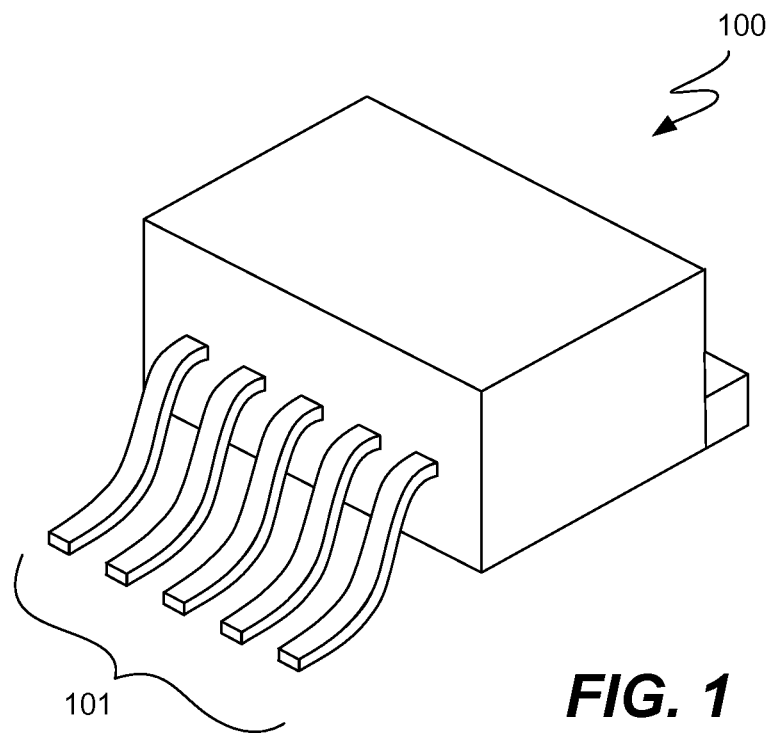
FIG. 1 is a perspective external view of a known type of TO-263 package.
Figure 2:
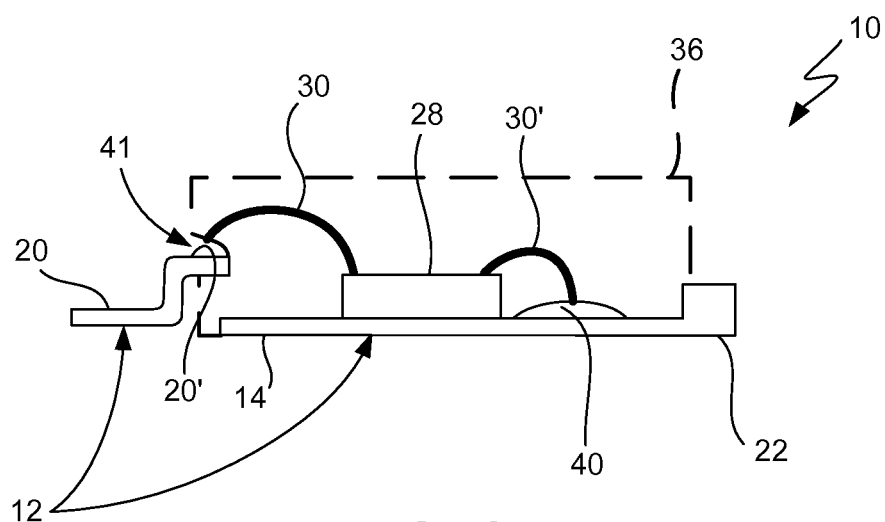
FIG. 2 is a cross-sectional view of a package showing the effects of delamination defects.

FIG. 2 illustrates a failure mode illustrated with respect to an industry standard TO-263 surface-mounting, highpower, leadframe semiconductor package 10. A protective plastic envelope 36 is molded over a device 28 (shown here by a dashed line that reveals the underlying package details). In some implementations, the package 10 is sometimes referred to as a "Dpak" package similar to other standardized surface-mounting packages of a known type in the industry, such as TO-263 packages.

A lead frame 12 of the standard package 10 comprises a rectangular die pad 14, a plurality of leads shown here in example cross-section view by lead 20, and a "header" 22 that are typically die-stamped from a dual-gage metal sheet, e.g., copper. A semiconductor die 28 incorporating an electronic device of the type described above is mounted on the upper surface of the die pad 14 with its lower surface in electrical connection with the pad 14. A plurality of wire bonds 30 are connected between bonding pads on the upper surface of the die 28 and wire bonding arms 20' at the ends of each of the leads 20. Additionally, in a typical application, at least one wire bond 30' is connected from the die 28 to the die pad 14. A protective plastic envelope 36 is molded over the leadframe 12, die 28, and wire bonds 30, 30' and a lower (bottom) surface of the die pad 14 is exposed and flush with the envelope to constitute a set of electrical contacts in addition to the previously mentioned leads 20.

While such packages 10 provide a workable housing and mounting for the above-described types of high-power devices, they also suffer from a few operational shortcomings that the inventors seek to remedy. In particular, a TO263 package is very sensitive to the presence of moisture. This moisture sensitivity is particularly problematic during solder reflow processes. Accordingly, as currently manufactured, TO263 packages are typically released subject to JEDEC Moisture Sensitivity Level 3 (as defined by Joint Electronic Devices Engineering Council (JEDEC) J-STD-020 industry testing standards; also known as "MSL3") handling guidelines. Such handling guidelines place significant restraints on the process conditions employed with the packages. Moreover, these shortcomings are exacerbated in packages that employ ground bonding (i.e., where ground connections of the die are wire bonded to the die attach pad (DAP) (See, e.g., 30' FIG. 2)).

Due to this sensitivity to moisture, existing TO263 packages suffer from a number of known failure modes. The inventors point out that one particular cause for concern is the aforementioned delamination failure. This failure mode will be further articulated with reference to FIG. 2. FIG. 2 depicts a simplified cross-section view of an existing TO263 package 10 that has undergone a delamination failure. As explained above, the package 10 includes a die 28 attached to a die attach pad 14 and a series of leads 20. The die 28 is electrically connected to the lead 20 using a wire bond 30 and also a wire contact "ground bond" 30' intended to electrically connect the die to the die attach pad 14. The die, the die attach pad, the wire bonds, and portions of the leads are all encapsulated with plastic material 36.

During repeated thermal cycling, handling stress, and other processing and usage strains on the package, delaminations can occur in the composite material used to encapsulate 36 the package. Referring again to FIG. 2, the illustration shows aspects of these delamination problems. Failure analysis has revealed that delaminations can occur at many locations within the package. However, extremely problematic are delaminations that occur between the encapsulate 36 and the die attach pad 14. One such defect of this type is identified as defect 40. Other types of delamination defects are problematic.

With continuing reference to FIG. 2 two types of delamination defects 40, 41 are illustrated. As mentioned above, in one common case, the encapsulant 36 can delaminate 40 from the die attach pad 14. With this type of separation or delamination the extremely fragile wire bond connection 30' at the die attach pad 14 can also become cracked or broken, leading to an electrical failure for the associated connection. Another delamination failure mode can occur at the interface between encapsulant 36 and the leads 20. This is illustrated by delamination 41 which also can lead to a cracking or separation of the wire bond 30 from the lead 20 causing another electrical failure. These modes of failure can occur due to the thermal mismatch between the encapsulant 36 and the die attach pad 14, the leads 20, or other electrically connected elements. These types of failure are particularly common after Moisture Sensitivity Level testing, indicating package sensitivity to heat and moisture conditions. This sensitivity to moisture is particularly troublesome because it can limit the process conditions that can be employed when using or processing the packages. Particularly problematic is the role this moisture sensitivity plays in limiting reflow processes. Current packages are severely limited by the MSL3 limitations of the packages. Accordingly, such existing packages can only be used under a narrow range of conditions. The inventors have discovered new lead frames and package configurations that enable a more robust device package enabling an exposure to a wider range of process conditions.

Figure 3:
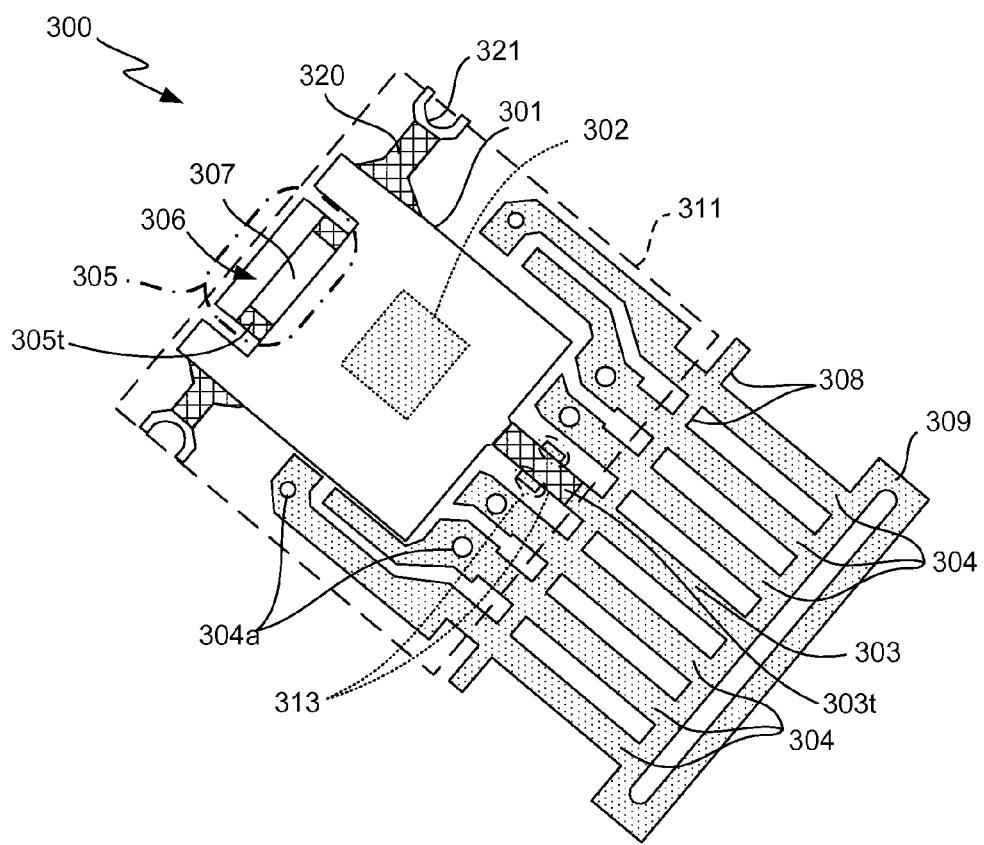
FIG. 3 is plan view of one lead frame embodiment constructed in accordance with the principles of the invention.

In accordance with an embodiment of the invention FIG. 3 depicts a lead frame implementation suitable for use with the invention. Such a lead frame can be used for high power surface mounted semiconductor packages such as TO-263 packages. The lead frame 300 is formed of a conductive material (e.g. metal) and in one particular embodiment is made from a copper material. The lead frame 300 includes a die attach pad 301 having a die attachment site 302 and an elongate ground lead 303 that extends from the pad. The lead frame 300 further includes a series of elongate leads 304 arranged about the die attach pad 301. In the depicted embodiment, the leads 304 extend in the same direction as the ground lead 303. The inventors point out that the leads 303, 304 can optionally include holes 304a or slots. These holes 304a are configured to enable encapsulant to flow through the hole 304a and then, upon curing, the encapsulant provides a mechanical locking effect which increases resistance to delamination. This increases the structural integrity of the resultant package and greatly improves the moisture resistance of the package.

The lead frame 300 further includes an "up-set" bonding pad 305 (roughly delineated by the depicted oval) that is electrically connected with the die attach pad 301. As shown here, the "up-set" bonding pad 305 is electrically and structurally connected to the die attach pad 301 using conductive tabs 305t (also referred to herein as "upset" tie-bars). The up-set bonding pad 305 also includes a bonding support 306 configured to support a plurality of wire bonds and arranged to include a large mold flow aperture 307 between the die attachment site 302 and the bonding support 306. The presence of the mold flow aperture enables a large flow of encapsulant (epoxy, plastic, or other molding material) to flow through the aperture and surround the up-set bonding pad 305 and bonding support 306 as well as any associated wires bonded to the bonding surfaces. Upon curing, the hardened encapsulant forms a wedge bond that stabilizes the encapsulant in the region near the bonding support and the associated wire bond connections and prevents delamination and the associated separating and failure of the wire bonds.

The inventors point out that embodiments of the lead frame 300 further include a tie bar 308 that temporarily couples the elongate leads 304 to the lead frame 300. In the particular depiction of FIG. 3, the temporary tie bar 308 connects the elongate leads 304 to the ground lead 303. Alternatively, more than one tie bar can be used to temporarily couple the elongate leads together with the die attach pad. Thus, as shown here, a second tie bar 309 is shown to further strengthen the lead frame 300. The tie bars (308, 309) typically lie outside the region of the lead frame that will be encapsulated (delineated by dashed line 311) during package encapsulation. Once the lead frame 300 is assembled and encapsulated, the tie bars (308, 309) can be easily cut away leaving the leads 303, 304 extending outward from the package.

Another feature that is employed in some embodiments of the invention is a shaped integral ground lead 303 that extends from the die attach pad 301. Ordinarily, such ground leads are narrow and linear in shape. The inventors have discovered that a variance in ground lead shape can both expand the area available for ground lead wire bonding (by creating more surface configuration) and decrease encapsulant delamination near the ground lead wire bonds. Thus, this shaped ground lead is capable of enabling greater reliability in the resultant package. The depicted ground lead 303 includes at least one bonding lobe (shown in the alternating dotted and dashed circles) 313. Each lobe 313 is generally sized large enough to present a bonding surface suitable for enabling wire bonding. Such wire bonding typically comprises a wire bond from a die to the lead. Although depicted here with two lobes 313 the inventors contemplate other embodiments constructed to include several such lobes. The embodiment depicted here attains a generally cross-shaped configuration (i.e., a generally cruciform arrangement) for the lead 303 and an associated pair of lobes 313. The lobes 313 in addition to providing an expanded bonding surface are configured such that encapsulant flows in and around the edges and surfaces of the lobes and ground lead to increase the effectiveness and adhesion of the encapsulant to the ground lead and accordingly increase the resistance of the resulting package to delamination failure. The ground lead 303 may also feature a mold flow aperture (such as 304a) to further enhance mold locking with the encapsulant.

As explained above, in some embodiments of the invention the leads 303, 304 include apertures 304a that lie within the encapsulant boundary 311. These apertures enable the liquid encapsulant to flow through the apertures during encapsulation. This enables the cured or hardened encapsulant to lock the leads 304 (which are typically input/output leads) in place and leads to increase the effectiveness and adhesion of the encapsulant to the leads and associated wire bonds and accordingly increase the resistance of the resulting package to delamination failure.

In some embodiments of the invention the lead frame further includes one or more holding arms 320 enabling the lead frame to be secured to a mounting jig. This will enable, among other things, effective mounting of a die onto the die attach pad, effective wire bonding, and effective encapsulation to form the final package. In the embodiment depicted in FIG. 3, the lead frame 300 is shown with two holding arms 320. More (or fewer) can be added in accordance with the needs of the associated lead frame. Additionally, in the depicted embodiment, each holding arm 320 includes a securement feature enabling the lead frame to be securely mounted onto an appropriate fixture. In this depicted embodiment, the securement feature includes a socket 321 enabling the lead frame 300 to be secured on a fixture. As will be apparent to those of ordinary skill, many different features can be employed as the securement feature 321.

Finally, the inventors point out that in some embodiments of the invention the leadframe is configured such that the bonding support 306 of the up-set tie bar 305 is elevated above the plane defined by the die attach pad 301. In one example, the bonding support 306 is supported above the die attach plane by the conductive tabs 305t. Moreover, a bonding surface of the ground lead 303 can also be raised above the plane defined by the die attach pad 301. For example, the portion 303t of the ground lead 303 having the cruciform feature is depicted as raising the lead 303 above the die attach plane. The invention does not require these raised features, the inventors only suggest that some embodiments of the invention can employ these raised features to advantageous effect.

In one non-limiting example, the lead frame is has the following example dimensions. The die attach pad 301 is about 6 millimeters (mm) by 5.5 millimeters. This of course can be of any necessary size as required by the user. Additionally, the bonding support 306 of the up-set tie bar can be about 3.5 mm by about 0.6 mm, with a large variety in possible sizes also being contemplated by the inventors. The apertures 304a are typically about 0.35-0.50 mm in diameter with a large variety in possible sizes also being contemplated by the inventors.

Figure 4A:
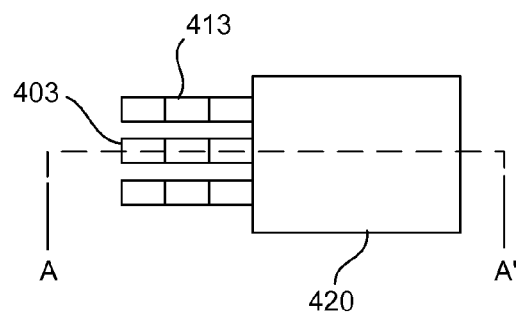
FIGS. 4 (a) and 4(b) are plan and cross-sectional views of a portion of a device package embodiment constructed in accordance with the principles of the invention.
Figure 4B:
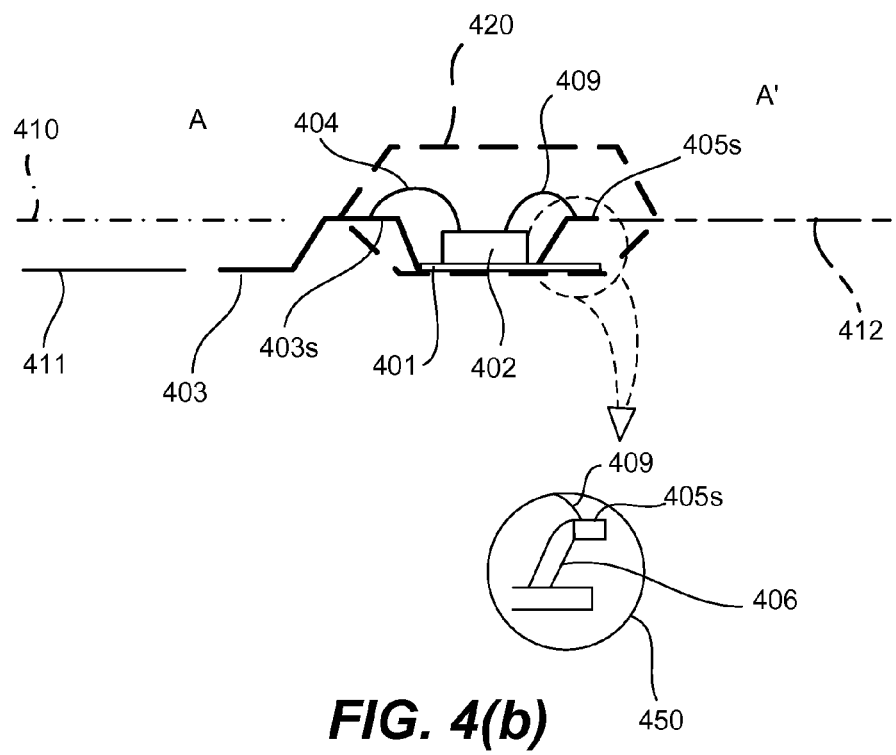

FIG. 4(a)-4(b) are simplified views of an encapsulated three lead package implementation constructed in accordance with the principles of the invention. The inventors contemplate that any number of leads may be employed using the lead frame and package embodiments described herein. In FIG. 4(a) an exemplar completed package is shown.

FIG. 4(b) is a side section view showing the interior position of the lead frame in a typical package embodiment. The package encapsulant 420 is shown encapsulating the electronic components to complete the package. Such encapsulants are comprised of many materials. Typically, these materials are electrically insulative molding materials. Examples, include, but are not limited to, plastics, epoxies, b-stageable materials, low-CTE materials, and any encapsulant and molding materials used by those of ordinary skill to encapsulate electronic packages. The package includes an integrated circuit die 402 mounted on a die attach pad 401 (such as illustrated in the example of FIG. 3) for example using die attach epoxy. The plane of the die attach pad 401 defines a die attach plane 411. A ground lead 404 is shown wire bonded to the die 402 and to a bonding surface 403s of a grounding lead 403. The inventors point out, that in this embodiment, the bonding surface 403s of the ground lead 403 is elevated to a raised lead plane 410 that is above the illustrated die attach plane 411. The inventors point out that the input/output (I/O) contacts 413 can also feature raised wire bonding contact points.

Further referring to FIG. 4(b), the die 402 is also wire bonded 409 to the bonding support 405s of the up-set bonding pad. The bonding support 405s of the up-set bonding pad is also in a raised plane 412. This raised plane 412 can be the same as the lead plane 410 however it is not required to be so.

The inventors point out that although the depicted embodiment has arranged the wire bonding surface 403s of the ground lead 403 and the bonding support 405s above the plane defined by the die attach pad (411), such is not strictly required to practice the invention. In one embodiment having such raised surfaces, the inventors contemplate that a thin metals or conductive sheet be used to form the lead frame. This thinness will enable the lead frame to be bent into an appropriate shape in an ordinary stamping process. For example, in one implementation the lead frame is constructed of a copper or copper alloy material in the range of about 10 mils to about 20 mils thick. The inventors understand that a lead frame having a thickness of about 15 mils thick is suitable many embodiments of the invention.

Further referring to the illustration window 450 of FIG. 4(b), the up-set tie bar includes the aperture 406 configured to enable encapsulant to flow around the bonding support 405s to increase adhesion to the up-set tie bar and the wire bonds attached thereto. This configuration has resulted in substantial increase in adhesion of the encapsulant to the lead frame and a reduction in the number of delamination failure of the associated device package.

Figure 5:
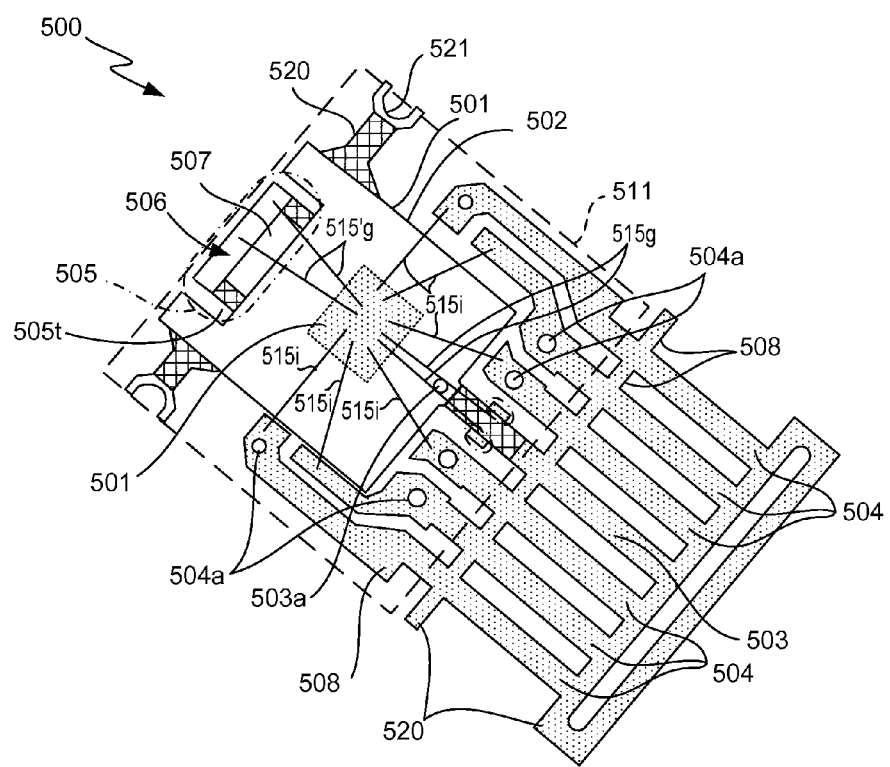
FIG. 5 is plan view of one package embodiment having a die mounted on the lead frame in accordance with the principles of the invention.
Figure 6:
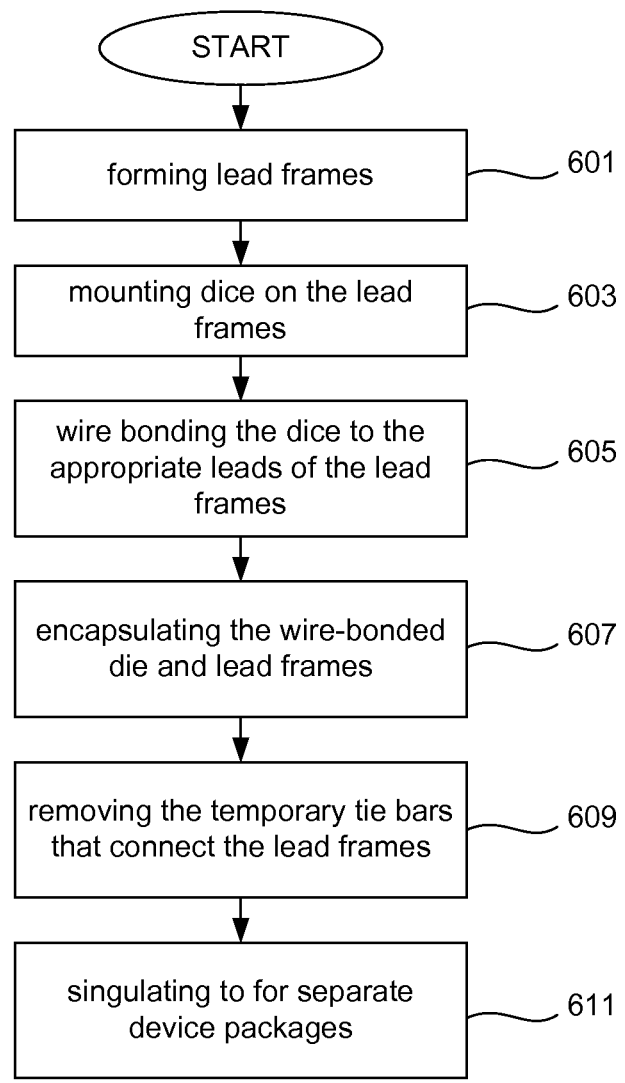
FIG. 6 is a flow diagram depicting one suitable method embodiment constructing a package embodiment in accordance with the principles of the present invention.

FIG. 5 depicts a top down view of a package mounted on the lead frame embodiment. The depicted package shows a view of an example TO263 package 500 constructed in accordance with the principles of the invention. A lead frame is processed to electrically connect the elements of the package. The die 501 attached to a die attach pad 502 formed of a conductive material (e.g. metal). The frame further includes an elongate cruciform ground lead 503 that extends from the pad. This ground lead is shown with both a cruciform feature and an aperture 503a. Also, the lead frame further includes a series of elongate I/O leads 504 arranged about the die attach pad 501. Each I/O lead 504 includes an aperture 504a located within the encapsulant envelope 508. Here the leads are held together with the rest of the leadframe with the removable tie-bar 520. The ground 503 and I/O leads 504 extending in the same direction. A portion of the ground lead 503 and I/O leads 504 each raised above the die attach plane in a lead plane. An "up-set" bonding pad 505 is electrically connected to the die attach pad 502 by conductive tabs 505t. As depicted in this configuration, the bonding support 506 is held above the die attach plane by the conductive tabs 505t. The up-set bonding pad 505, the tabs 505t, and the pad 502 define a large mold flow aperture 507. Input/output wire bonds 515i connect the die 501 to raised portions of the associated I/O leads 504. Additionally, wire bonds 515g connect the die 501 to the ground lead 503. Also, wire bonds 515g' connect the die 501 to the bonding support 506 of the up-set bonding pad 505. It is noted that packages formed in accordance with the principles of the invention have substantially improved delamination characteristics and are far more resistant to heat and moisture conditions. In fact, embodiments of the invention enable a JEDEC Moisture Sensitivity Level 1 characterization level for packages so constructed. This enables the packages formed in accordance with the invention to sustain virtually indefinite heat and moisture exposure. This is particularly useful when applied to TO-263 packages constructed in accordance with the principles of the invention. Moreover, due to the very thin nature of the die attach pad and the small degree of being used in the package TO-263 packages constructed in accordance with the principles of the invention can attain thicknesses of less than 2 millimeter thick.

A typical process for forming such packages begins by forming the lead frames (Step 601). Commonly, this will be accomplished by stamping out the lead frames from a thin sheet of conductive material. In one example, a 15 mil thick sheet of copper can be stamped into an appropriate configuration using standard stamping processes known to those having ordinary skill in the art. For example, a lead frame having a die attach pad, a raised up-set bonding pad, a cruciform ground lead having a raised portion, and raised I/O leads can be stamped from copper sheet in accordance with the principles of the invention.

A die can be mounted to a die attachment site on the die attach pad (Step 603). The die is then wire bonded appropriately to selected I/O leads, the ground lead, and the up-set bonding pad using standard wire bonding processes (Step 605).

The lead frame and associated wire bonded elements is then treated with encapsulant material to seal the die and wire bonds and portions of the leads (Step 607). Common encapsulation processes can be used to seal the package. Many package molding materials known to those having ordinary skill in the art can be used to seal the package. Once cured and appropriately hardened, the packages can then have the temporary tie bars removed from the leads (ground and I/O) to enable separate connection of the leads. The packages are then singulated to separate the devices into separate device packages (Step 609). The inventors point out that Steps 607 & 609 can be performed in reverse order or, alternatively, be performed together.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein. The inventors further indicate that, although process steps, method steps, algorithms or the like may be described in a sequential order, such processes, methods and algorithms may be configured to work in alternate orders. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the invention(s), and does not imply that the illustrated process is preferred.

We claim:

1. A high power surface mounted semiconductor package comprising:
   a lead frame having:
   (i) a die attach pad having a die attachment surface and an elongate ground lead that extends in a first direction;
   (ii) a plurality of input/output (I/O) elongate leads arranged about the die attach pad, said leads also extending in said first direction; and
   (iii) an up-set bonding pad electrically connected with the die attach pad, the up-set bonding pad including a bonding support configured to support a plurality of wire bonds and arranged to include a large mold flow aperture between the die attachment site and the bonding support;
   a semiconductor integrated circuit die mounted on the die attachment surface of the die attachment pad;
   a set of wire bonds comprising at least one wire bond electrically connecting the die to at least one of: the bonding support of the up-set bonding pad; the elongate ground lead, and at least one of the I/0 leads; and
   a mold envelope encapsulating the package with a mold material, the envelope encapsulating the die; an upper portion of the attach pad; a portion of the ground lead; portions of the I/0 leads, the up-set bonding pad; and the set of wire bonds and wherein the mold materials fill the mold flow aperture to form a mold locking feature.

2. The semiconductor package of claim 1, wherein the
   the die attachment surface comprises, a first and an opposing second edge;
   the elongate ground lead directly connects to said first edge of the die attach pad and extends in a first direction;
   the up-set bonding pad being arranged such that it is directly connected to said second edge of the die attach pad by a pair of conductive tabs that electrically connect the up-set bonding pad with the elongate ground lead through the die attach pad, the up-set bonding pad further including a bonding support surface configured to support a plurality of wire bonds and arranged to be raised by the pair of conductive tabs above a plane defined by the die attachment surface, there being a space framed by the pair of conductive tabs thereby comprising the mold flow aperture that is filled with the mold material.

3. The semiconductor package of claim 1, wherein the package comprises a TO-263 package in compliance with the JEDEC Moisture Sensitivity Level 1 standard.

4. The semiconductor package of claim 1, wherein the up-set bonding pad is configured such that it is electrically connected with the die attach pad by a pair of conductive tabs.

5. The semiconductor package of claim 4, wherein the mold flow aperture is defined by a space between the up-set bonding pad, the pair of conductive tabs, and the die attach pad.

6. The semiconductor package of claim 4, wherein the bonding support of the bonding pad is raised by the tabs above a plane defined by the die attach pad.

7. The semiconductor package of claim 1, wherein the lead frame has a thickness of
   about 15 thousandths of an inch.

8. The semiconductor package of claim 1, wherein the elongate ground lead includes
   bonding lobes that extend from the ground lead to form an expanded space on the ground lead for wire bonding, and
   wherein said wire bonds extend from the die to the bonding lobes to electrically connect the die to the ground lead.

9. The semiconductor package of claim 8, wherein the elongate ground lead comprises a generally cruciform shape having a bonding lobe that extends from each side of the ground lead to form the expanded space on the ground lead for wire bonding.

10. The semiconductor package of claim 8, wherein:
    the bonding lobes form tabs that extend from opposing sides of the elongate ground lead to form a ground lead bonding surface than is wider than portions of the elongate ground lead that are immediately adjacent to and directly connect to the ground lead bonding surface; and
    the plurality of elongate (I/O) leads each include an end that is adjacent to but not in direct contact with the die attach pad, wherein the end of each lead includes a hole arranged to allow the molding material to flow through the hole and help secure the molding material around the elongate (I/O) lead.

11. The semiconductor package of claim 10, wherein the elongate ground lead and the
    plurality of elongate (I/O) leads are arranged in adjacent rows and are connected with one another via one or more tie bars that are arranged perpendicular to the elongate ground lead and the plurality of elongate (I/O) leads.

12. The semiconductor package of claim 11 wherein the elongate ground lead includes a hole arranged to allow the molding material to flow through the hole and help secure the molding material to the elongate ground lead.

13. The semiconductor package of claim 11, wherein:
    the die attach pad includes a notched portion; and
    the pair of tabs is connected to the notched portion of the die attach pad and raise the up-set bonding pad directly over the notched portion of the die attach pad.

14. The semiconductor package of claim 1, wherein the lead frame further includes: (iv) at least one holding arm attached to the die attach pad wherein a holding are includes a socket enabling the lead frame to be secured on a fixture.

15. The semiconductor package of claim 1, wherein the plurality of elongate leads further include at least one disposable tie bar that temporarily couples the elongate leads together with the other portions of the lead frame.

* * * * *